(12) United States Patent
Telefus et al.

(10) Patent No.: US 11,050,236 B2
(45) Date of Patent: Jun. 29, 2021

(54) SOLID-STATE LINE DISTURBANCE CIRCUIT INTERRUPTER

(71) Applicant: intelesol, llc, Danville, CA (US)

(72) Inventors: Mark Telefus, Orinda, CA (US); Bradley Larson, Sunnyvale, CA (US); Harry Rodriguez, Gilroy, CA (US); Stephen C. Gerber, Austin, TX (US)

( * ) Notice: Subject to any disclaimer, the term of this patent is extended or adjusted under 35 U.S.C. 154(b) by 320 days.

(21) Appl. No.: 16/093,044

(22) PCT Filed: May 5, 2017

(86) PCT No.: PCT/US2017/031207
§ 371 (c)(1),
(2) Date: Oct. 11, 2018

(87) PCT Pub. No.: WO2017/196649
PCT Pub. Date: Nov. 16, 2017

(65) Prior Publication Data
US 2019/0207375 A1  Jul. 4, 2019

Related U.S. Application Data

(60) Provisional application No. 62/431,926, filed on Dec. 9, 2016, provisional application No. 62/414,467, filed (Continued)

(51) Int. Cl.
*H02H 3/00* (2006.01)
*H02H 1/00* (2006.01)
(Continued)

(52) U.S. Cl.
CPC ............ *H02H 3/00* (2013.01); *G01R 15/202* (2013.01); *G01R 19/0092* (2013.01); *H02H 1/0007* (2013.01); *H02H 1/0015* (2013.01); *H02H 1/06* (2013.01); *H02H 3/33* (2013.01); *H02H 3/50* (2013.01); *H02H 9/08* (2013.01);
(Continued)

(58) Field of Classification Search
CPC .. H02H 3/00; H02H 3/33; H02H 1/06; H02H 3/50; H02H 1/0015; H02H 1/0007; H02H 9/08; H02H 3/52; H02H 1/0092; H02M 1/32; H02M 7/217; H02M 7/06;
(Continued)

(56) References Cited

U.S. PATENT DOCUMENTS 4,466,071 A  8/1984  Russell, Jr.
4,581,540 A  4/1986  Guajardo
(Continued)

OTHER PUBLICATIONS

Carvou, E. et al, Electrical Arc Characterization for Ac-Arc Fault Applications, 2009 Proceedings of the 55th IEEE Holm Conference on Electrical Contacts, IEEE Explore Oct. 9, 2009.
(Continued)

*Primary Examiner* — Dharti H Patel
(74) *Attorney, Agent, or Firm* — Mark Wisnosky (57) ABSTRACT

The invention relates to a novel approach for the protection of electrical circuits from ground faults and parallel and series arc faults in a fully solid-state circuit configuration. Solid-state circuits and methods of use are described that provide the key functions of low-voltage DC power supply, mains voltage and current sensing, fault detection processing and high voltage electronic switching.

11 Claims, 9 Drawing Sheets

Related U.S. Application Data on Oct. 28, 2016, provisional application No. 62/335,495, filed on May 12, 2016.

(51) Int. Cl.

| | | |
|---|---|---|
| *H02H 9/08* | (2006.01) | |
| *H02H 3/33* | (2006.01) | |
| *H02H 1/06* | (2006.01) | |
| *H02H 3/50* | (2006.01) | |
| *H02H 3/52* | (2006.01) | |
| *H02M 7/217* | (2006.01) | |
| *G01R 15/20* | (2006.01) | |
| *G01R 19/00* | (2006.01) | |
| *H02M 1/32* | (2007.01) | |
| *H02M 7/06* | (2006.01) | |

(52) U.S. Cl.
CPC .............. *H02M 1/32* (2013.01); *H02M 7/217* (2013.01); *H02H 1/0092* (2013.01); *H02H 3/52* (2013.01); *H02M 7/06* (2013.01)

(58) Field of Classification Search
CPC .............. G01R 15/202; G01R 19/0092; G01R 31/3277; G01R 31/52
USPC .......................................................... 361/42
See application file for complete search history.

(56) References Cited

U.S. PATENT DOCUMENTS

| | | | |
|---|---|---|---|
| 4,631,625 A | 12/1986 | Alexander et al. | |
| 4,812,995 A | 3/1989 | Girgis et al. | |
| 5,121,282 A | 6/1992 | White | |
| 5,371,646 A | 12/1994 | Biegelmeier | |
| 5,796,274 A | 8/1998 | Willis et al. | |
| 5,933,305 A | 8/1999 | Schmaltz et al. | |
| 6,141,197 A | 10/2000 | Xu | |
| 6,188,203 B1 | 2/2001 | Rice et al. | |
| 6,839,208 B2 | 1/2005 | MacBeth et al. | |
| 6,984,988 B2 | 1/2006 | Yamamoto | |
| 7,110,225 B1 | 9/2006 | Hick | |
| 7,319,574 B2 | 1/2008 | Engel | |
| 7,586,285 B2 | 9/2009 | Gunji | |
| 7,948,719 B2 | 5/2011 | Xu | |
| 8,463,453 B2 | 6/2013 | Parsons, Jr. | |
| 8,717,720 B2 | 5/2014 | Deboer | |
| 8,817,441 B2 | 8/2014 | Callanan | |
| 8,947,838 B2 | 2/2015 | Yamai et al. | |
| 9,577,420 B2 | 2/2017 | Ostrovsky et al. | |
| 2003/0063420 A1* | 4/2003 | Pahl | H02H 1/0015 361/93.1 |
| 2005/0286184 A1* | 12/2005 | Campolo | H02H 1/0015 361/42 |
| 2008/0174922 A1* | 7/2008 | Kimbrough | H02H 3/16 361/42 |
| 2008/0180866 A1 | 7/2008 | Wong | |
| 2008/0204950 A1 | 8/2008 | Zhou et al. | |
| 2009/0168273 A1 | 7/2009 | Yu et al. | |
| 2010/0091418 A1 | 4/2010 | Xu | |
| 2011/0156610 A1 | 6/2011 | Ostrovsky et al. | |
| 2012/0089266 A1 | 4/2012 | Tomimbang et al. | |
| 2013/0128396 A1* | 5/2013 | Danesh | H02H 3/006 361/45 |
| 2016/0178691 A1* | 6/2016 | Simonin | G01R 31/327 361/42 |
| 2017/0322258 A1* | 11/2017 | Miller | H02H 1/0007 |

OTHER PUBLICATIONS

Yang et al, Series Arc Fault Detection Algorithm Based on Autoregressive Bispectrum Analysis, Algorithms 2015, 8, 929-950; doi:10.3390/a8040929.

Restrepo, Arc Fault Detection and Discrimination Methods, Electrical Contacts—2007 Proceedings of the 53rd IEEE Holm Conference on Electrical Contacts, IEEE Explore Sep. 24, 2007.

* cited by examiner

SOLID-STATE LINE DISTURBANCE CIRCUIT INTERRUPTER

CROSS-REFERENCE TO RELATED APPLICATIONS

This application claims priority to: U.S. Provisional Patent Application 62/414,467, Titled: High Efficiency AC to DC Converter and Methods, Filed Oct. 28, 2016. U.S. Provisional Patent Application 62/333,193, Titled: AC Direct power management semiconductor device and power management method, Filed May 7, 2016, U.S. Provisional Patent Application 62/335,495, Titled: AC Direct LVO Electronic Dimming Switch, Filed May 12, 2016, and, U.S. Provisional Patent Application 62/431,926, Titled: Electronic Switch and Dimmer, Filed Dec. 9, 2016, all of which include a common inventor, and are hereby incorporated by reference in this application.

STATEMENT REGARDING FEDERALLY SPONSORED RESEARCH OR DEVELOPMENT

Not Applicable.

BACKGROUND OF THE INVENTION

Technical Field

The invention relates to a power distribution system and in particular to a fully solid-state circuit interrupter for disconnecting power from a distribution system to a consumer load when a disturbance such as a ground fault or an arc fault is detected by a proprietary fault detection processor incorporated in the interrupter.

Related Background Art

Protection of electrical supply systems is accomplished primarily using fuses and circuit breakers that protect against damage to the distribution system by excessive currents by terminating the current flow in the event of a short circuit or an overload condition. Secondarily, ground fault interrupters (GFIs) are used in branch circuits largely to protect consumers from electrical shock resulting from unintended current flow directly to ground by interrupting the current flow as soon as a threshold leakage current is detected. More recently, arc fault interrupters (AFIs) have been employed to reduce the hazard of structure fires that can be started by sparks generated by electrical arc faults.

An arc fault occurs when two conductors in a circuit become so closely spaced that electrical breakdown of the intervening material occurs allowing current to flow intermittently between the conductors. The breakdown and resulting current flow are accompanied by extremely high temperatures, well above the ignition point of typical construction materials thereby presenting an immediate fire hazard in the vicinity of the arc fault.

Arc faults that occur from line to line, line to neutral or line to ground are termed parallel arc faults and typically result in excessive current that trips either the circuit breaker or the GFI device. Arc faults that occur within a line, caused, for example, by the accidental cutting of one conductor in a circuit, are in series with the load and may not be interrupted by the circuit breaker or the GFI. Thus, more sophisticated sensing schemes have been developed to robustly detect series arc faults and trigger disconnection of the affected circuit. The arc fault sensing scheme is further complicated by a need to minimize false triggers caused by complex loads like switching power supplies and dimmer circuits which exhibit current-voltage relationships that mimic arc faults. The sophisticated arc fault sensing schemes typically require more complex circuitry than the simple and bulky electromechanical devices employed in prior art circuit breakers and GFIs. The more complex AFI circuitry typically consists of solid-state analog and digital devices such as operational amplifiers and microprocessors. Thus, there is a need for an all solid-state approach to integrating GFI and AFI functions in a compact, low power interrupter configuration.

BRIEF SUMMARY OF THE INVENTION

The present invention relates to a novel approach for the protection of electrical circuits from ground faults and parallel and series arc faults in a fully solid-state circuit configuration. Solid-state circuits are described that provide the key functions of low-voltage DC power supply, mains voltage and current sensing, fault detection processing and high voltage electronic switching.

An efficient solid-state AC to DC power conversion system is described. The system and related devices address the need for a compact, integrated, low cost design, that is highly efficient and provides access to the low voltages used to drive typical silicon based electronic devices used in home sensors and networking, smart cars, etc. In one embodiment, the system includes an efficient electronic switch employed to disconnect the input of a series voltage regulator circuit from a rectified AC mains power supply to reduce the power dissipated within the series regulator. While the switch is closed, energy is accumulated and stored in a shunt energy storage element. The electronic switch is opened when the rectified AC mains waveform exceeds a threshold value. While the switch is open, energy is supplied to the load by the energy storage element through the regulator circuit. In this way the benefits of the regulator circuit accrue to the attached load circuitry while the power dissipated within the regulator circuit is greatly reduced compared to the prior art. A comparator is used to control the electronic switch. In one embodiment the comparator is comprised of an operational amplifier and a reference voltage source. In another embodiment the comparator is comprised of a MOS field effect transistor. In one embodiment the MOS field effect transistor is controlled through a voltage divider.

One embodiment uses power MOS field-effect transistors (MOSFETs) as electronic switches having very low "on" resistance connected between the AC mains supply and the desired load. Since typical power MOSFETs intrinsically incorporate a body diode in parallel with the conducting channel, pairs of devices are connected in a back-to-back arrangement having the source terminals in common to provide a truly bidirectional (AC) switch configuration. In order to control the switching action of the power MOSFETs a novel floating control circuit is employed that uses rectifying diodes connected at the drains to precharge the gate-source bias voltage thereby turning both devices "on", and an optically coupled phototransistor that shorts the gate terminals to the common source terminal to force the devices into their "off" state when illuminated by an isolated optical source. Thus, the power MOSFET switches are normally "on" unless forced "off" by the optical control signal. The optical control signal can be applied continuously for nominal on-off control of the power delivered to the load, or it can be synchronized with the AC mains waveform to provide phase control. Integrated control circuitry for the optical control signal can provide either leading edge phase control preferred for switching reactive loads or trailing edge phase control preferred for nonlinear loads such as LEDs.

The specific examples are not intended to limit the inventive concept to the example application. Other aspects and advantages of the invention will be apparent from the accompanying drawings and detailed description.

DETAILED DESCRIPTION OF THE INVENTION

Figure 1A:
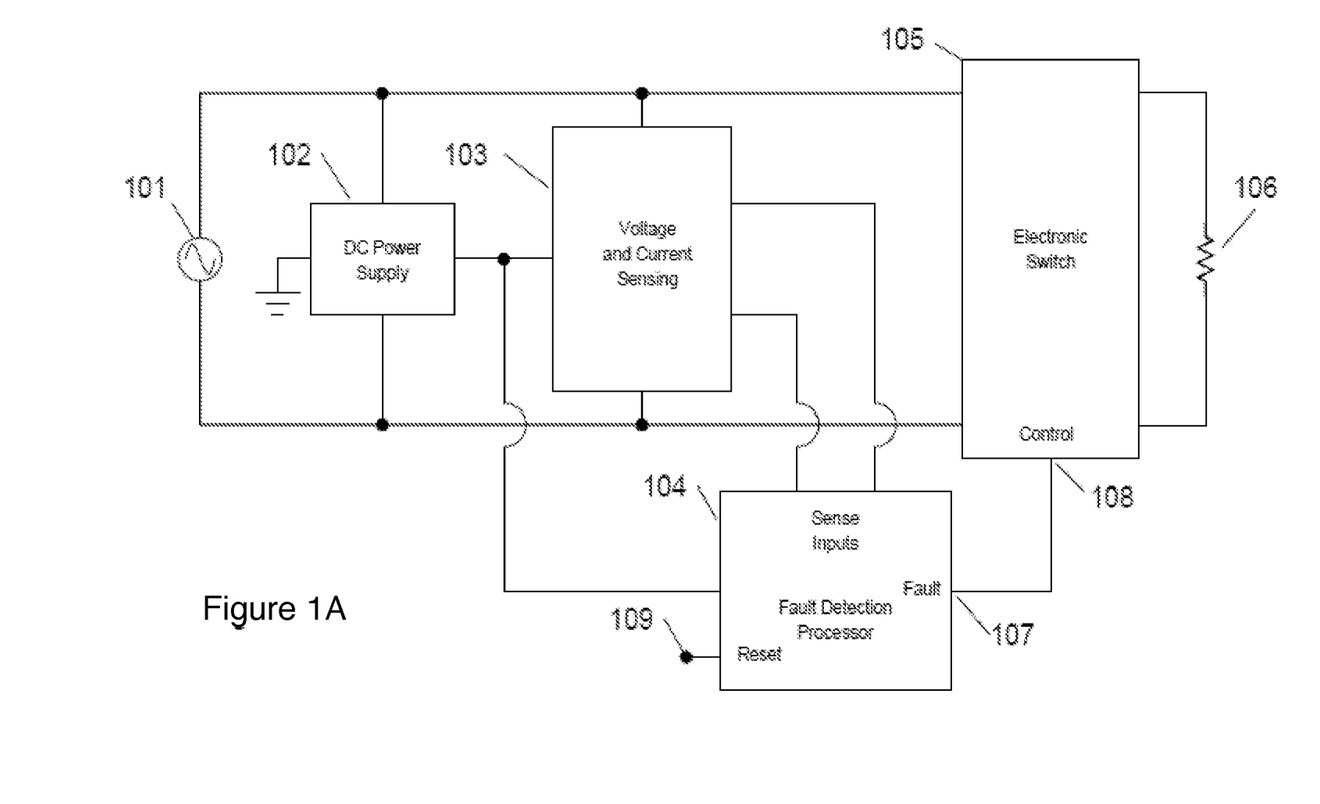
FIG. 1A is a block diagram showing the key elements of the solid-state circuit interrupter.

Commonly numbered items in all the Figures refer to the same item throughout the description. FIG. 1A is a block diagram showing the key elements of the solid-state circuit interrupter. AC mains 101 is connected to load 106 through electronic switch unit 105. A low voltage DC power supply 102 efficiently provides power for mains voltage and current sensing circuit 103 and the fault detection processor 104. Sense inputs to the fault detection processor 104 are provided from the voltage and current sensing circuit 103. The solid-state sensing circuit comprising sensors that sense the waveforms of the voltage and current applied to the load circuit, and, develop proportional analog waveforms. The fault detection processor processes the proportional analog waveforms and upon detection of either a ground fault or an arc fault generates a fault output 107.

Upon detection of a fault, the Fault output 107 of the fault detection processor 104 is latched and fed to the control input 108 of electronic switch 105 which disconnects the load 106 from the mains 101 until a reset 109 is applied to the fault detection processor 104. In another embodiment the output voltage of the Electronic Switch 105 can be varied through the control circuit 108. In this embodiment upon detection of an arc fault, the output voltage can be reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc fault for subsequent replacement or repair.

Figure 1B:
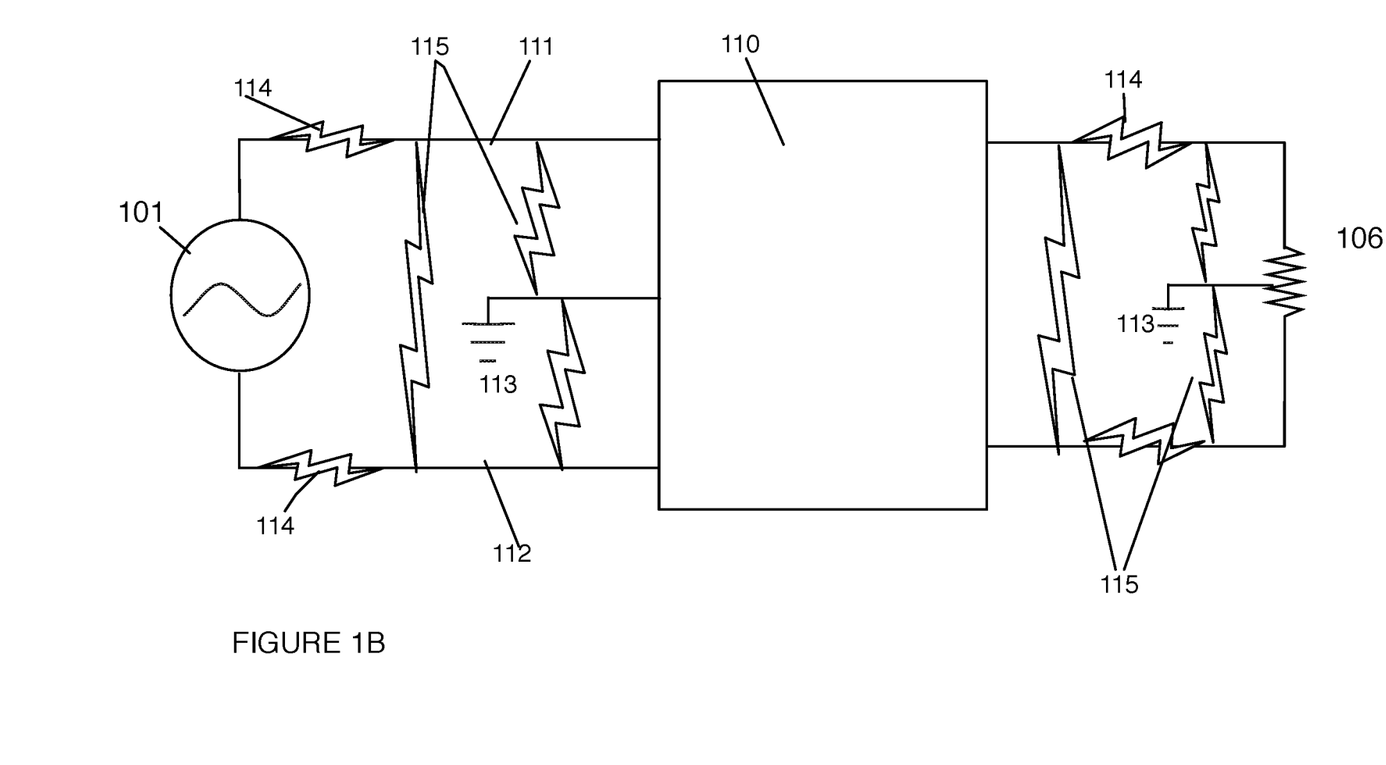
FIG. 1B is a block diagram showing location of circuit faults.

FIG. 1B shows typical locations of faults in a power supply system. In one embodiment the circuit interrupter 110 is located between the AC Mains supply 101 and the load 106. Arc faults can be in series 114 and occur in both the line 111 and neutral 112 both before 116 the circuit interrupter and after 117 the circuit interrupter. Parallel faults 115 can occur on either side of the circuit interrupter both between line and neutral and between line or neutral and ground 113. In one embodiment the circuit interrupter 110 is located between the AC Mains 101 and the load 106, such as in an outlet plug. There are a plurality circuit interrupters installed in the AC supply network. In one embodiment multiple circuit interrupters are located in branches of the AC supply network. In another embodiment (not shown) a plurality of circuit interrupters are located in series in the same branch of the AC supply network. Detection of a fault is based upon analysis of both the voltage and the current associated with the fault. A plurality of fault detectors in series can, based upon the current analysis determine a location of a fault relative to the circuit interrupters.

Figure 2:
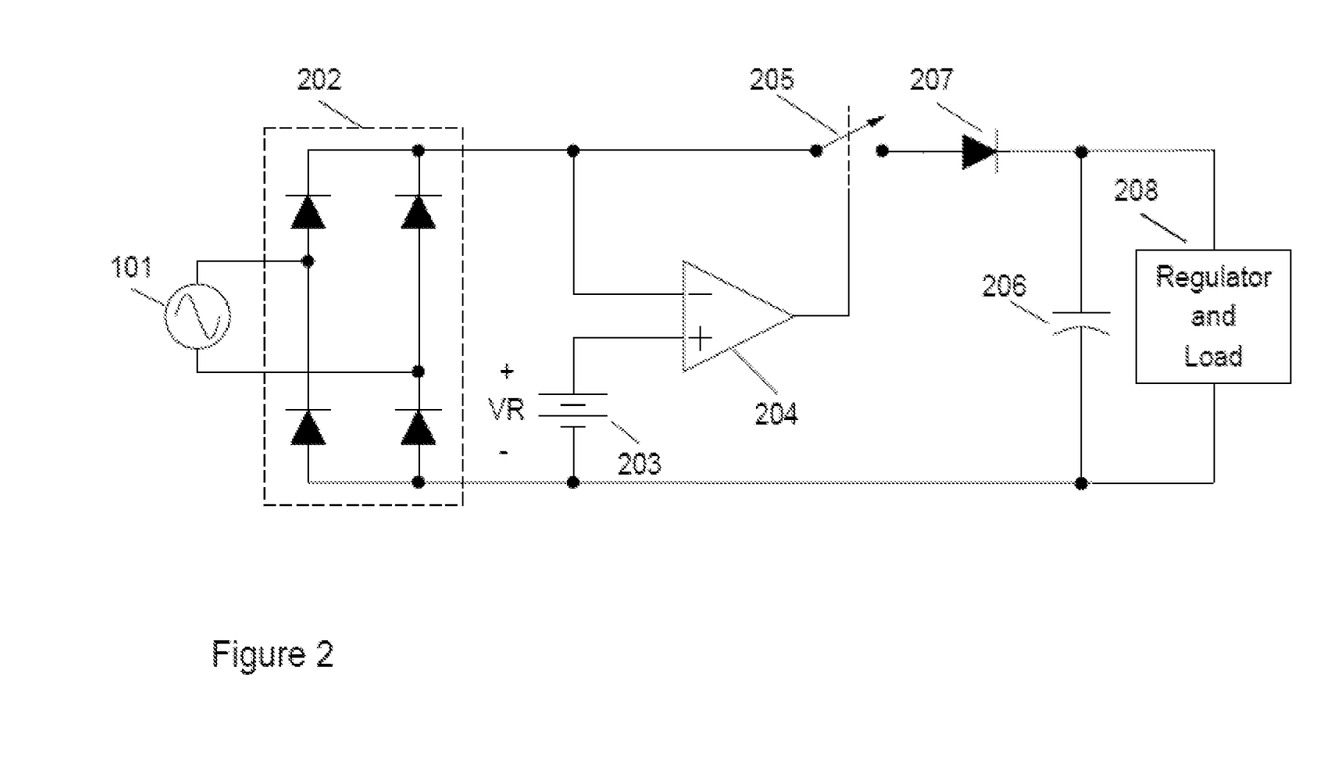
FIG. 2 is a schematic diagram showing the functions in the AC-DC converter circuit.

FIG. 2 shows a schematic diagram of an improved AC-DC converter circuit that includes the AC mains 101 and a diode bridge 202. The waveform at the diode bridge 202 output is simply a full-wave rectified sinusoidal waveform that conventionally varies from 0V to approximately 170V peak for a conventional AC mains having an rms value of 120V. Note, however, that the method described below applies to any periodic power waveform assuming that the numeric specifications of the affected components are suitably adjusted. Additionally, the power waveform can include a DC offset if it is smaller than the reference voltage described below.

The circuitry includes a comparator circuit 204 having its inverting input connected to the diode bridge 202 output and a voltage reference 203 connected to its non-inverting input, wherein the comparator 204 controls a series switch 205 that disconnects the diode bridge output from succeeding circuitry (opens switch 205) if the diode bridge output voltage exceeds the reference voltage $V_R$. When the reference voltage $V_R$ exceeds the diode bridge output voltage then switch 205 is closed and capacitor 206 is charged through series diode 207. Diode 207 keeps capacitor 206 from discharging back through switch 205 when the diode bridge output voltage decreases. The combination of diode 207 and capacitor 206 form a "peak detector" circuit that stores energy in each one-half of an AC mains cycle to supply to subsequent regulator circuitry and the load 208. The voltage across capacitor 206 need only be large enough to satisfy the energy requirement of the subsequent regulator circuitry and load 208. The input voltage to the series regulator is significantly reduced compared to the rms value of the AC mains. The operation of the "peak detector" circuit ensures the peak voltage stored on capacitor 206 is always $V_R$, regardless of fluctuations in the peak voltage of the AC mains, as long as the voltage of the AC mains remains larger than $V_R$. This embodiment of a switching circuit operates as a voltage regulator circuit itself. Since the operation of switch 205 uses negligible energy, the efficiency of the AC-DC converter circuit shown in FIG. 2 is much larger than seen for the prior art circuits. An additional benefit is a significant reduction in the heat generated by the circuit, thereby reducing the operating temperature rise. Although the comparator 204 is a well-known analog circuit element other analog or digital circuits could be employed to accomplish the desired thresholding function needed to operate switch 205.

Figure 3:
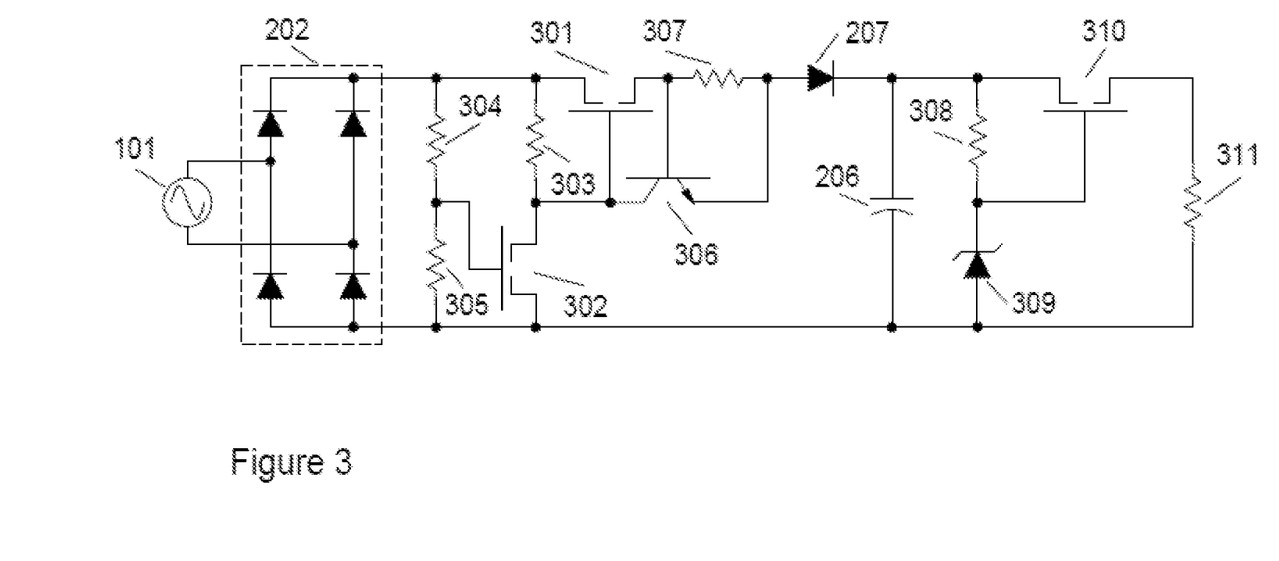
FIG. 3 is a schematic diagram of an embodiment of the AC-DC converter using MOS transistors.
Figure 4:
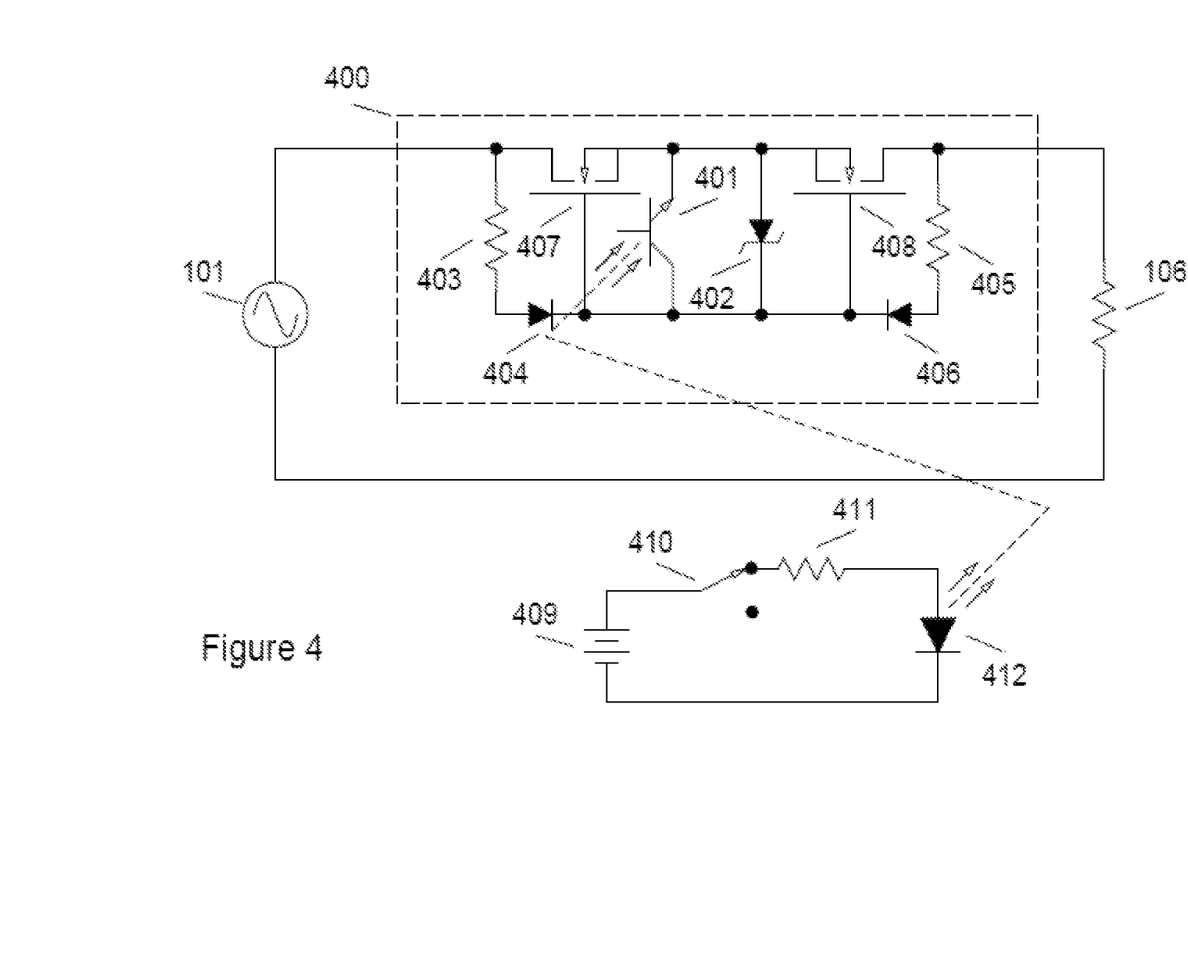
FIG. 4 is a schematic diagram of an embodiment of a bidirectional switch using power MOSFETs.

FIG. 3 shows a schematic diagram of the AC-DC converter circuit wherein the switch 205 shown in FIG. 2 is implemented using an enhancement mode MOSFET 301 and the comparator circuit 204 is realized as a single common-source amplifier stage also using an enhancement mode MOSFET 302 characterized by a threshold voltage, $V_T$, and a load resistor 303. Thus, when the output of the voltage divider network comprising resistors 304 and 305 exceeds the threshold voltage of MOSFET 302, $V_T$, the gate of switch 301 is pulled to ground thereby opening switch 301. When the output of the voltage divider network is smaller than $V_T$ the gate of MOSFET 301 is connected to its drain, thereby closing the switch. The AC-DC converter circuit further includes bipolar transistor 306 and current sensing resistor 307 to limit the charging current through MOSFET 301 and diode 207. The regulator function is a conventional series regulator circuit accomplished using series pass transistor 310 connected to load 311 and biased by Zener diode 309 which sets the DC output voltage and is biased through resistor 308. FIG. 4 is a schematic diagram showing an embodiment of an optically isolated bidirectional electronic switch circuit element. In switching unit 400 Zener diode 402 has a Zener voltage greater than the threshold voltage of the power MOSFETs and is biased through rectifier diodes 404 and 406 connected at the drain terminals of the power MOSFETs and protected by current limiting resistors 403 and 405, respectively. Thus, in the absence of incident illumination resistor-diode branches 403-404 and 405-406 provide bias for Zener diode 402 when either of the drain terminals exceeds the Zener voltage, placing power MOSFETs 407 and 408 in the "on" state. When illuminated by control circuit LED 412 powered by external DC source 409 through control switch 410 and bias resistor 411, phototransistor 401 shunts the bias current from branches 403-404 and 405-406 to the source terminals of the power MOSFETS placing them in the "off" state. In this circuit the turn-on time constant is dictated by the value of the current limiting resistors 403 and 405 and the gate-to-source capacitance of the power MOSFETs, while the turn-off time constant is dictated by the saturation current of the phototransistor 401 at the illumination level provided by LED 412.

Figure 5:
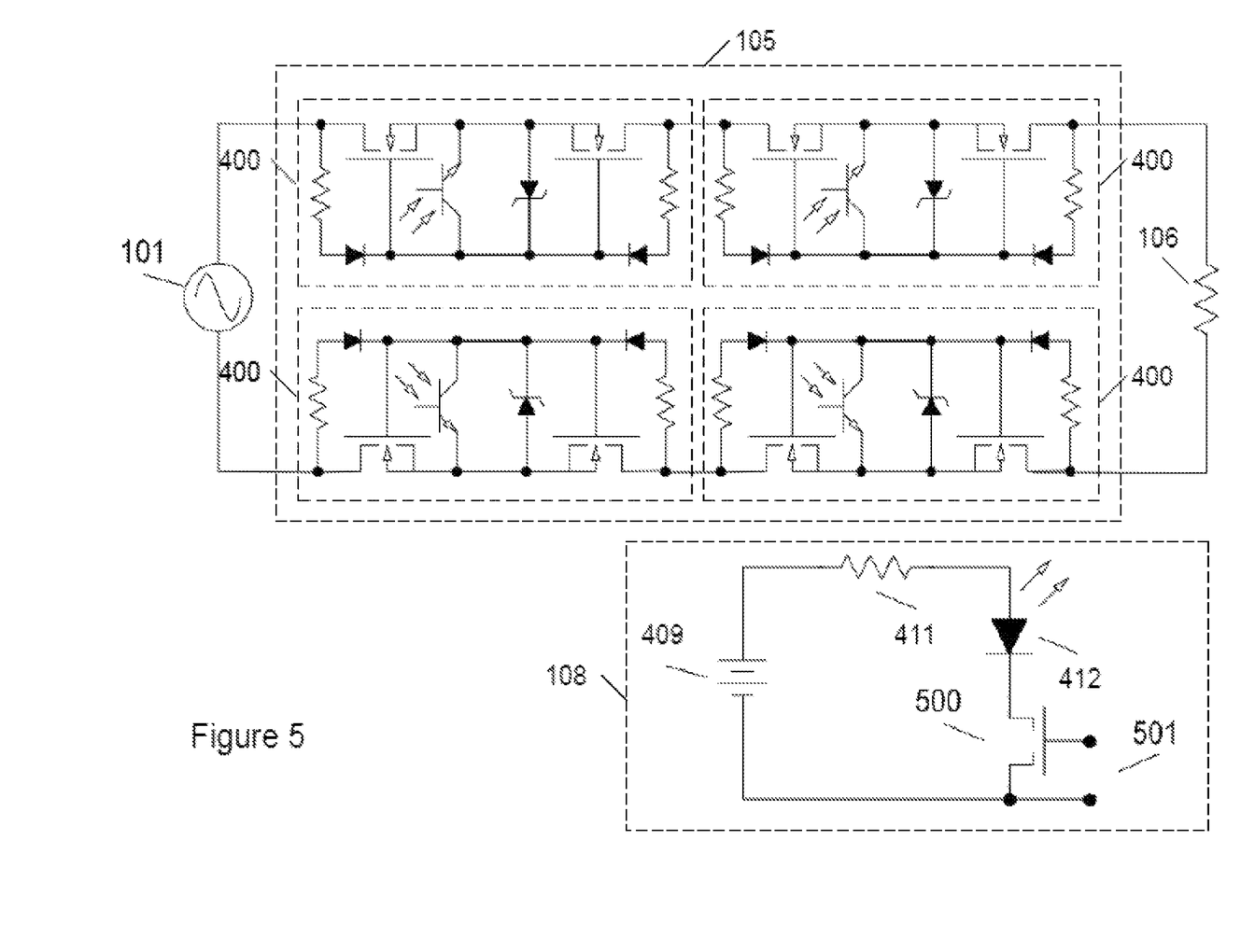
FIG. 5 is a schematic diagram of the bidirectional switch using four switching elements to reduce total switch "on" resistance and increase total switch "off" resistance.

FIG. 5 is a schematic diagram of the embodiment of FIG. 4 using two switch units 400 in each arm of the AC supply to improve the performance of the circuit. In this configuration the four switch units 400 comprise the electronic switch 105 shown in FIG. 1A. In the preferred embodiment the power MOSFETs are selected to have one-fourth the breakdown voltage of the units used in FIG. 4. Because of the relationship between breakdown voltage and "on" resistance of MOSFET devices, the "on" resistance of the individual switch units can be expected to be reduced by a factor of 32 and the total "on" resistance of the two switch units connected in series is reduced by a factor of 8 relative to the circuit in FIG. 4. Additionally, the voltage drop across each of the switch units in the "off" state is quartered, thereby reducing the $dV_{ds}/dt$ experienced by each unit by a factor of four and consequently reducing the "off" state leakage current. Additionally, the inventor has found experimentally that this circuit configuration further improves the turn-off characteristics of the switch devices, further reducing leakage currents. In this figure control switch 410 is replaced with transistor 500 which is operated through control port 501 which together with DC supply 409, resistor 411 and LED 412 comprise the control circuit 108 shown in FIG. 1A. In another embodiment, Transistor 500 is controlled by an external control voltage applied to control terminals 501. This allows for the rapid switching of the LED in synchronism with the AC mains waveform through external control circuitry (not shown) to provide phase control of the output of the switch. In this embodiment power to the load is reduced upon occurrence of a fault signal. In another embodiment the control signal is a variable DC voltage allowing variable illumination of the LED thereby allowing the MOSFETs to operate in a linear mode.

In another embodiment the output voltage and power of the Electronic Switch is varied through the control circuit 108. Upon detection of an arc fault, the output voltage can be reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc fault for subsequent replacement or repair.

Figure 6:
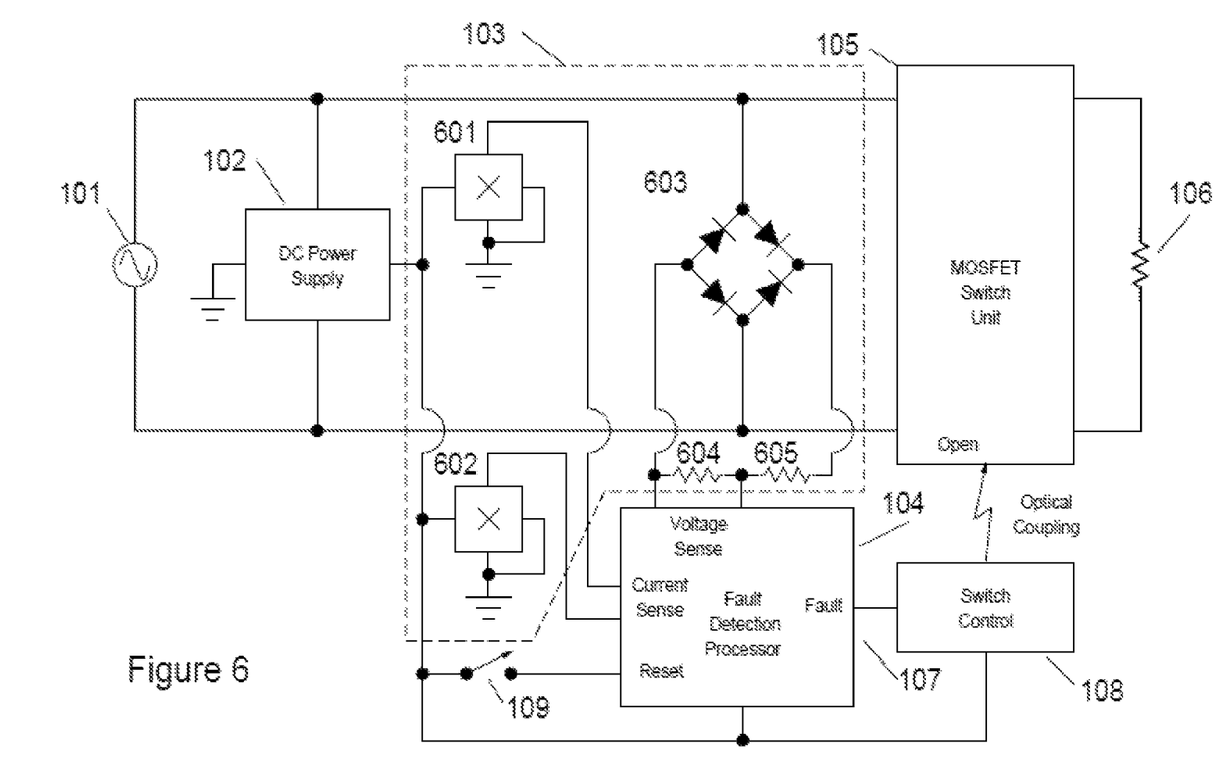
FIG. 6 is a schematic diagram of an embodiment of the solid-state circuit interrupter.

FIG. 6 is a schematic diagram of an embodiment of the solid-state circuit interrupter. AC mains 101 is connected to load 106 through bidirectional MOSFET switch unit 105 as depicted in FIG. 5. Low voltage DC power supply 102 as shown in FIG. 3 efficiently provides power for mains voltage and current sensing circuit 103, the fault detection processor 104 and the bidirectional MOSFET switch control circuit 108. Sense inputs to the fault detection processor 104 are provided from the voltage and current sensing circuit 103. Current sensing is provided using solid-state Hall Effect sensors 601 and 602 which provide an output voltage proportional to the current flowing through the sensor. The Hall Effect sensor outputs are fed to the current sense inputs of the fault detection processor 104. The AC mains voltage waveform is full-wave rectified in bridge unit 603. (In order to reduce the number of components in the circuit, bridge 603 can be eliminated and the full-wave rectified waveform obtained directly from the output of bridge 202 in the AC-DC converter circuit. Bridge 603 is illustrated here for clarity.) The full-wave rectified waveform is attenuated using a resistive divider network comprising resistors 604 and 605 and applied to the voltage sense inputs of the fault detection processor 104. Upon detection of a fault, the Fault output 107 of the fault detection processor 104 is latched and fed to the control input of electronic switch control circuit 108 which provides the optical control signal to the bidirectional MOSFET switch unit 105 which disconnects the load 106 from the mains 101 until a reset 109 is applied to the fault detection processor 104. In another embodiment the output voltage of the Electronic Switch is varied through the control circuit 108. In this embodiment upon detection of an arc fault, the output voltage is reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc fault for subsequent replacement or repair.

Figure 7:
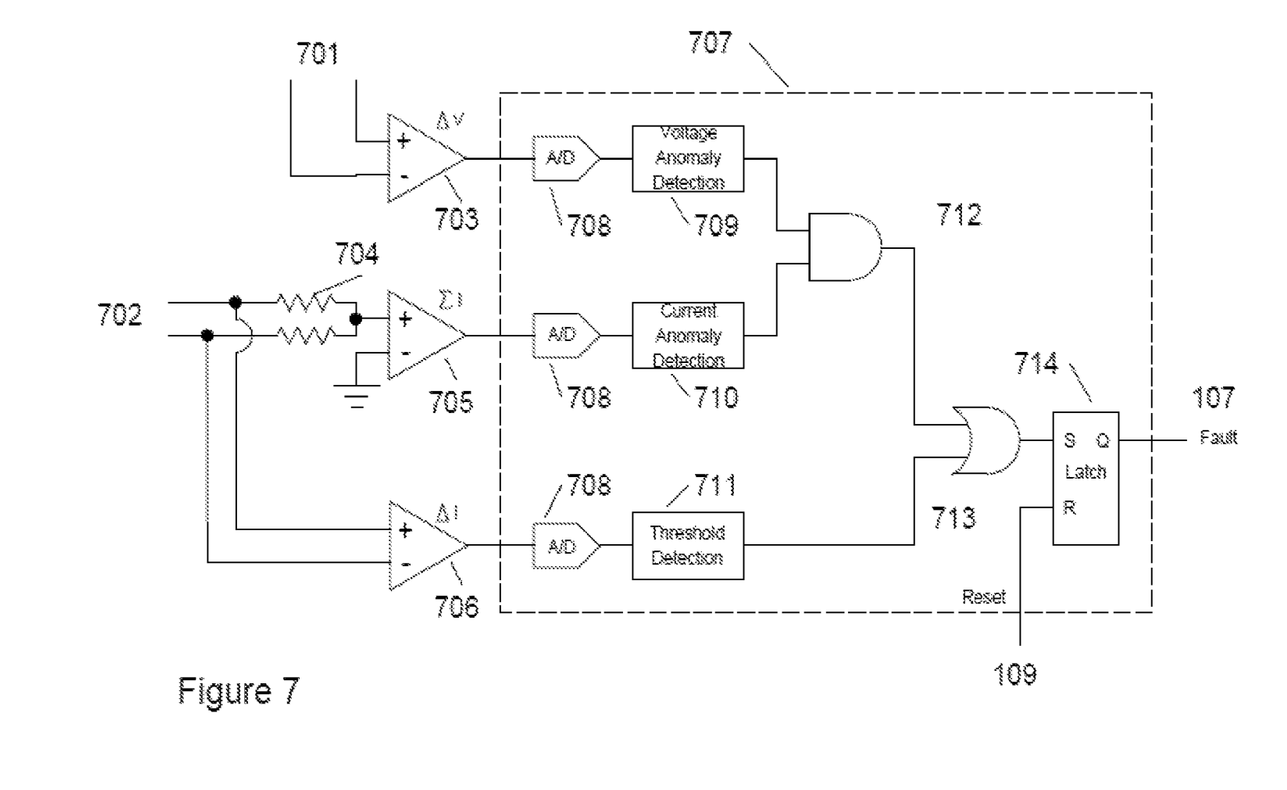
FIG. 7 is a schematic diagram showing an embodiment of the Fault Detection Processor

FIG. 7 is a schematic diagram showing an embodiment of the Fault Detection Processor. The voltage sense signals are applied to the input terminals of a differential amplifier and the resulting difference signal $\Delta V$ is applied to the input of an analog-to-digital (A/D) converter 708 within microprocessor 707. Similarly, the current sense inputs are summed in the input circuit 704 of operational amplifier 705 forming a signal proportional to the sum of the currents $\Sigma I$ in the line and neutral legs of the AC mains 101. The $\Sigma I$ signal is also applied to the input of an A/D converter.

The digitized $\Delta V$ signal is processed by subprogram 709 within the microprocessor to detect anomalies in the voltage waveform over several cycles that indicate the presence of an arc fault. One nonlimiting example of such a voltage anomaly is the presence of excess high frequency energy impressed upon the normally low frequency AC mains voltage waveform.

The digitized ΣI signal is processed by subprogram 710 within microprocessor 707 to detect anomalies in the current waveforms over several cycles that indicate the presence of an arc fault. One nonlimiting example of such a current anomaly is the occurrence of "shoulders" (flat spots) in the current waveform that occur near zero-crossings of the current waveform. The combined appearance of a voltage waveform anomaly and a current waveform anomaly is one indicator of an arc fault 712.

The current sense signals are also applied to the inputs of operational amplifier 706 which forms a difference signal ΔI proportional to the difference between the currents in the line and neutral legs. The ΔI signal is digitized and is processed by subprogram 711 which accomplishes a threshold detection that signals a ground fault 713. Arc fault 712 and ground fault 713 signals are combined and applied to the input of latch 714 which stores the fault condition 107 until cleared by an external reset signal.

Figure 8:
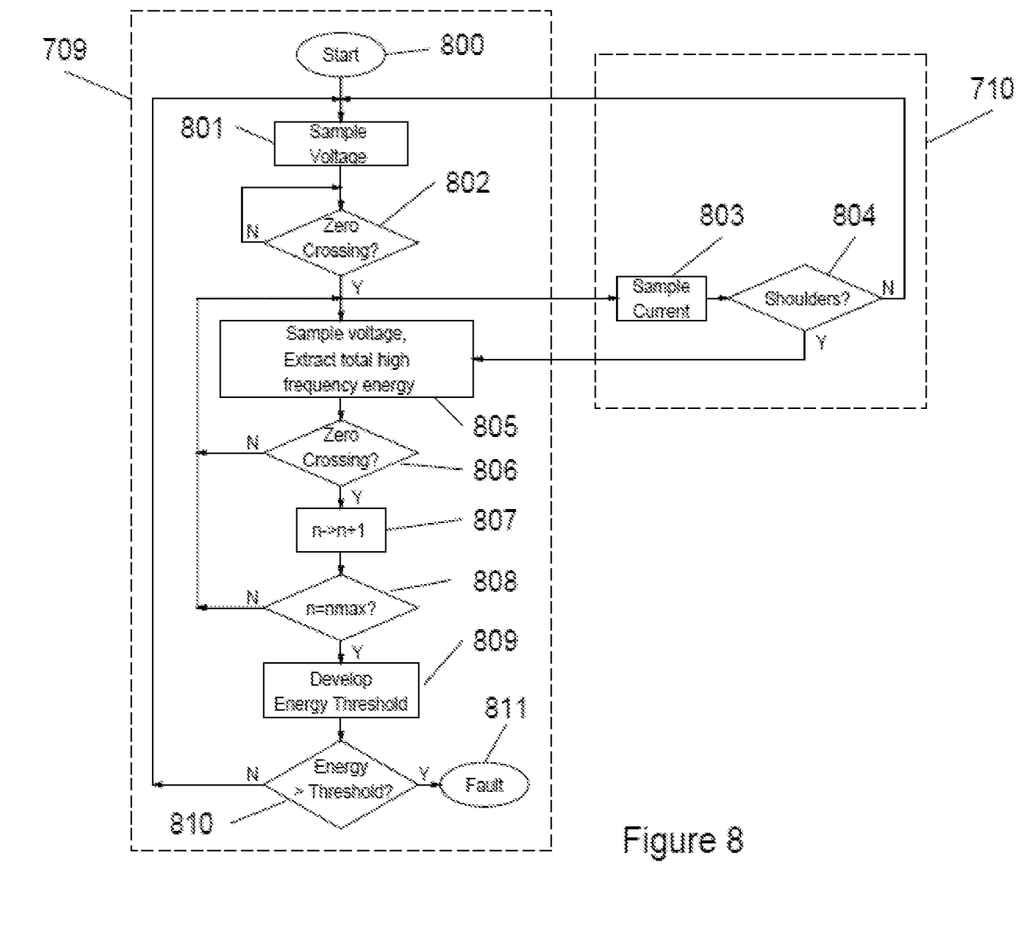
FIG. 8 is a flow chart of an embodiment of the voltage and current anomaly detection processes.

FIG. 8 shows a flow chart for nonlimiting examples of the voltage anomaly detection subprogram 709 and the current anomaly detection subprogram 710 described above. Upon starting 800, primary variables are initialized 801 and the subprocess loops 802 until a first voltage zero crossing is detected. Since the breakdown leading to an arc is voltage driven, any current shoulder (if one exists) will be time coincident with a voltage zero crossing. Upon detecting an initial voltage zero crossing the voltage 805 and current 803 are both sampled. A shoulder is declared to be detected 804 in the current anomaly detection process 710 if the current remains below a preset threshold for at least a preset minimum duration, $t_{min}$, but not more than a preset maximum duration, $t_{max}$. If the current exceeds the threshold while less than $t_{min}$ the process exits the current anomaly detection subprocess and returns to the start 800 until the next voltage zero crossing occurs. On the other hand, if the current remains less than the threshold for longer than $t_{max}$ then the current is taken to be "off" and the process returns to start 800. The voltage anomaly discriminant is developed from the high frequency content of the voltage waveform 805. High pass filtering with zero time lag can be achieved by differentiating the waveform and accumulating the square of the resulting differential as a measure of the high frequency energy over the measurement period. To form a threshold against which to compare this total high frequency energy, the squared differential is accumulated separately during a detected current shoulder (as signaled by the current anomaly detection subprocess) when there is no arc 808, 809. Thus, it should represent only the background noise energy during the shoulder periods. This is repeated over a number (n) of cycles of the voltage waveform 806, 807 and if the accumulated noise eventually exceeds a weighted average threshold 810 an arc fault is declared 811. Note that since the detection of current shoulders 804 is required for the successful formation of the noise energy threshold, this fault declaration derives from the combined presence of current shoulders and excess voltage noise energy. In another embodiment the detection of a fault 811, causes the control circuit (see FIG. 5) for the switch to reduce the output power to the load 106. In another embodiment the detection of a fault causes the control circuit to the switch to reduce the output voltage to the load. In another embodiment the detection of a fault causes a reduction of a preselected increment of either the power or the voltage to the load and the process of FIG. 8 then cycles back to start 800. The system again is tested for a fault and the voltage or power is again incrementally reduced until a fault 811 is not detected.

SUMMARY

A novel approach is described for the protection of electrical circuits from ground faults and parallel and series arc faults in a fully solid-state circuit configuration. Solid-state circuits are described that provide the key functions of low-voltage DC power supply, mains voltage and current sensing, fault detection processing and high voltage electronic switching.

We claim:

1. A solid-state circuit interrupter for an AC electrical supply circuit that supplies power to a load circuit, having an applied voltage and an applied current, and controls the power upon detecting ground faults, and, parallel and series arc faults, in the load circuit, the circuit interrupter comprising:
   a. a solid-state AC-DC converter circuit providing low-voltage DC power to a fault detection circuit and a solid state sensing circuit,
   b. the solid-state sensing circuit comprising sensors that sense the waveforms of the applied voltage and applied current to the load circuit, and, develop proportional analog waveforms of the applied voltage and the applied current, and,
   c. a fault processing circuit comprising:
      i. a solid-state processor that processes the proportional analog waveforms, and upon at least one of: 1) detecting the presence of a ground fault in the load circuit and 2) detecting the presence of an arc fault in the load circuit, generates a fault output signal, and,
      ii. a reset port that stops the fault output signal upon receiving a reset signal, and,
   d. a solid-state bidirectional electronic switch circuit disposed between the AC electrical supply circuit and the load circuit, and, electrically isolated from the AC-DC converter circuit, the sensing circuits, and the processing circuit, the solid-state bidirectional electronic switch having a control circuit connected to the fault output signal and a power output connected to the load, wherein the power output of the switch circuit has a voltage and a current.

2. The circuit interrupter of claim 1 wherein the switch circuit disconnects the power output to the load circuit when the fault output signal is generated.

3. The circuit interrupter of claim 2 wherein the switch circuit disconnects the load circuit from the supply circuit within one AC power cycle.

4. The circuit interrupter of claim 1 wherein the control circuit of the switch circuit reduces the output voltage from the solid-state bidirectional electronic switch to the load circuit when fault output signal is generated.

5. The circuit interrupter of claim 1 wherein the AC-DC converter comprises:
   a. a rectifier circuit driven by said AC supply circuit and providing a time varying direct current voltage waveform as an output,
   b. an energy storage element capable of providing energy in the form of a direct current and operably connected to said internal load, and c. the solid-state bidirectional electronic switch having a threshold voltage interposed between said rectifier circuit and said energy storage element wherein:
    i. the solid-state bidirectional electronic switch is open when said time varying voltage waveform exceeds said threshold voltage, and
    ii. the solid-state bidirectional electronic switch is closed when said time varying voltage waveform is exceeded by said threshold,
d. electronic circuitry interposed between the electronic switch and the energy storage element to limit the current flowing through the electronic switch, and
e. a voltage regulation circuit interposed between said energy storage element and said internal load.

6. The interrupter of claim 5 wherein the subprogram to accomplish signal processing on the digitized voltage and current waveforms to effect the detection of arc faults further comprises:
  a. a subprogram that detects the presence of substantial subintervals that occur over a preset measurement time interval wherein the amplitude of the current waveform is less than a preset value, and
  b. a subprogram that calculates the total noise energy contained within the digitized voltage waveform over the preset measurement time interval and further calculates a threshold energy value from the noise energy contained within the digitized voltage waveform during the subintervals wherein the amplitude of the digitized current waveform is less than the preset value, and
  c. a subprogram that signals the detection of an arc fault if the sum of the subintervals wherein the amplitude of the digitized current waveform is less than the preset value obtained over the preset measurement time interval falls within a preset range of time interval values and the total noise energy contained within the digitized voltage waveform exceeds the calculated threshold energy value.

7. The circuit interrupter of claim 1 wherein the solid-state circuits for sensing the waveforms of the voltage and current applied to the load circuit comprise:
  a. hall-effect current sensors having DC bias terminals and current sense terminals with one unit mounted to each of the power supply lines with DC bias provided by the AC-DC converter and with sense terminals attached to the fault detection circuit, and
  b. a rectifier circuit driven by said AC supply circuit and providing a time varying direct current voltage waveform as an output wherein the voltage waveform is attenuated using a resistive divider and the resulting attenuated voltage waveform is applied to the fault detection circuit.

8. The circuit interrupter of claim 1 wherein the fault detection circuit comprises:
  a. interface circuits powered by the AC-DC converter operably connected to the voltage and current sensing circuits to condition the proportional analog waveforms producing conditioned proportional analog waveforms,
  b. a microprocessor powered by the AC-DC converter and programmed to digitize the conditioned proportional analog waveforms, producing digitized current and voltage waveforms, and,
    i. to execute a subprogram to accomplish signal processing on the digitized current and voltage waveforms to effect the detection of ground faults, and
    ii. to execute a subprogram to accomplish signal processing on the digitized current and voltage waveforms to effect the detection of arc faults, and
  c. a latch circuit having a set condition and a reset condition powered by the AC-DC converter and placed in the set condition by the detection of either fault and remaining in the set condition until placed in the reset condition using an external reset signal.

9. The circuit interrupter of claim 1 wherein the bidirectional electronic switch circuit has an input terminal and an output terminal and further comprises:
  a. first and second series connected electronic switch devices, each switch device having a drain terminal, a source terminal and a gate terminal and being characterized by a threshold voltage specified between the gate terminal and the source terminal, wherein the drain terminal of the first switch device comprises the input terminal of the switch circuit and drain terminal of the second switch devices comprise the output terminal of the switch circuit, the source terminals of the first and second switch devices are interconnected at a first control terminal and the gate terminals of the first and second switch devices are interconnected at a second control terminal, and;
  b. a voltage source comprising a first rectifier device connected from the input terminal of the switch circuit to the second switch device control terminal and a second rectifier device connected from the output terminal of the switch circuit to the second switch device control terminal and a voltage regulator device connected from the first switch device control terminal to the second switch device control terminal having a voltage that exceeds the switch device threshold voltage and applied across the first and second switch device control terminals through a current limiting resistor; and
  c. a switch comprising a photo-activated electronic device characterized by a conductance proportional to the intensity of illumination incident upon the photo-activated electronic device and connected from the first switch device control terminal to the second switch device control terminal; and
  d. a light emitting device powered by the AC-DC converter and arranged to illuminate the photo-activated device and activated by the fault detection circuit when a fault is signaled.

10. The circuit interrupter of claim 9 wherein the bidirectional electronic switch circuit further includes control circuitry and phase control of the power output of the switch to the load.

11. The circuit interrupter of claim 9 wherein the bidirectional electronic switch circuit further includes control circuitry and linear control of the power output of the switch to the load.

* * * * *